(12) United States Patent
George

(10) Patent No.: US 8,147,630 B2
(45) Date of Patent: Apr. 3, 2012

(54) METHOD AND APPARATUS FOR WAFER BONDING WITH ENHANCED WAFER MATING

(75) Inventor: Gregory George, Colchester, VT (US)

(73) Assignee: Suss Microtec Lithography, GmbH, Garching (DE)

( * ) Notice: Subject to any disclaimer, the term of this patent is extended or adjusted under 35 U.S.C. 154(b) by 270 days.

(21) Appl. No.: 12/618,846

(22) Filed: Nov. 16, 2009

(65) Prior Publication Data

US 2010/0122762 A1    May 20, 2010

Related U.S. Application Data

(60) Provisional application No. 61/115,101, filed on Nov. 16, 2008.

(51) Int. Cl.
*B32B 41/00* (2006.01)

(52) U.S. Cl. .......... 156/64; 156/273.7; 156/285; 29/833

(58) Field of Classification Search .................... 156/64, 156/273.7, 285, 378, 379.7, 382, 497; 29/833
See application file for complete search history.

(56) References Cited

U.S. PATENT DOCUMENTS

| | | |
|---|---|---|
| 2003/0168145 A1 | 9/2003 | Suga et al. |
| 2007/0287264 A1 | 12/2007 | Rogers |
| 2007/0296035 A1 | 12/2007 | George et al. |
| 2008/0164606 A1 | 7/2008 | Greisen et al. |
| 2008/0245472 A1* | 10/2008 | Hirata et al. ................. 156/264 |

* cited by examiner

*Primary Examiner* — George Koch
(74) *Attorney, Agent, or Firm* — Aliki K. Collins; AKC Patents LLC

(57) ABSTRACT

An improved wafer-to-wafer bonding method includes aligning an upper and a lower wafer and initiating a bond at a single point by applying pressure to a single point of the upper wafer via the flow of pressurized gas through a port terminating at the single point. The bond-front propagates radially across the aligned oppositely oriented wafer surfaces at a set radial velocity rate bringing the two wafer surfaces into full atomic contact by controlling the gas pressure and/or controlling the velocity of the motion of the lower wafer up toward the upper wafer.

13 Claims, 13 Drawing Sheets

METHOD AND APPARATUS FOR WAFER BONDING WITH ENHANCED WAFER MATING

CROSS REFERENCE TO RELATED CO-PENDING APPLICATIONS

This application claims the benefit of U.S. provisional application Ser. No. 61/115,101 filed Nov. 16, 2008 and entitled "METHOD AND APPARATUS FOR WAFER BONDING WITH ENHANCED WAFER MATING", the contents of which are expressly incorporated herein by reference.

FIELD OF THE INVENTION

The present invention relates to an improved method and apparatus for semiconductor wafer bonding, and more particularly to industrial-scale semiconductor wafer bonding that provides enhanced wafer mating.

BACKGROUND OF THE INVENTION

Wafer-to-wafer (W2W) bonding is deployed in a wide range of semiconductor process applications for forming semiconductor devices. Examples of semiconductor process applications where wafer-to-wafer bonding is applied include substrate engineering and fabrication of integrated circuits, packaging and encapsulation of micro-electromechanical-systems (MEMS) and stacking of many processed layers (3D-integration) of pure microelectronics. W2W bonding involves aligning two or more wafer surfaces, bringing them in contact and forming a strong bond interface between them. The overall processing yield and manufacturing cost of the so produced semiconductor devices and ultimately the cost of the electronic products that incorporate these devices depend greatly upon the quality of the wafer-to-wafer bond. The quality of the W2W bond depends upon the uniformity and integrity of the bond strength and the preservation of the alignment of the wafers across the wafer bond interfaces.

There are a number of wafer-to-wafer bonding methods, including direct/fusion/oxide wafer bonding, thermocompression bonding, adhesive bonding and metal diffusion bonding, among others. Direct wafer bonding refers to a process where two separate wafer surfaces are brought into contact and are bonded without any intermediate adhesives or external force. The initial bond strength is usually weak, and therefore a subsequent annealing step is generally carried out to strengthen the bond. The direct wafer bonding process can be viewed as a three-step process, including surface activation, room temperature bonding and annealing. The room temperature bonding, also known as pre-bonding is based on inter-atomic and intermolecular forces, also known as Van-der-Waals forces, hydrogen or water bridges. These forces are relatively weak. However, in many cases, a spontaneous bonding of two clean and flat surfaces occurs when initiated only in one single point. Typically the bonding is initiated in the center or at the edge. Once the bonding is initiated a so-called bonding front propagates across the bonding interface.

As was mentioned above, a significant parameter of the bond quality is the preservation of the initial alignment of the wafer surfaces. Several alignment wafer methods have been suggested that produce submicron alignment accuracy of the wafers. However, the follow-up steps of the bonding process distort the submicron accuracy of the initial alignment resulting in a final product where the wafer alignment may be degraded to more than several micron accuracy level. Accordingly, there is a need for an improved semiconductor wafer bonding operation that maintains the initial accurate alignment of the wafers throughout the entire bonding process.

SUMMARY OF THE INVENTION

In general, in one aspect, the invention features a method for bonding semiconductor structures including the following. Positioning a first surface of a first semiconductor structures directly opposite to and at a first distance from a first surface of a second semiconductor structure within a fixture tool of an aligner equipment. Aligning the first surfaces of the first and second semiconductor structures parallel to each other to submicron alignment accuracy. Bringing the aligned first surfaces of the first and second semiconductor structures at a second distance from each other wherein the second distance is less than the first distance. Bringing the aligned first surfaces of the first and second semiconductor structures into atomic contact at a single point and forming a bond interface by applying pressure to the single point via a pressurized gas flowing through a port terminating at the single point. Propagating the bond interface radially across a portion of the first surfaces of the first and second semiconductor structures by controlling the pressurized gas. Reducing the pressure of the pressurized gas and bringing the first surfaces of the first and second semiconductor structures into full contact with each other. Clamping the first and second semiconductor structures together within the fixture tool and bonding the clamped first and second semiconductor structures.

Implementations of this aspect of the invention may include one or more of the following features. The fixture tool comprises first and second fixture tool components and a first surface of the first fixture tool component is placed in contact with a second surface of the first semiconductor structure and a first surface of the second fixture tool component is placed in contact with a second surface of the second semiconductor surface. The second surfaces of the first and second semiconductor structures are opposite to the first surfaces of the first and second semiconductor structures, respectively. The aligner comprises oppositely arranged first and second chucks and a second surface of the first fixture tool component is in contact with the first chuck and a second surface of the second fixture tool component is in contact with the second chuck. The second surfaces of the first and second fixture tool components are opposite to the first surfaces of the first and second fixture tool components, respectively. The first and second surfaces of the first and second semiconductor structures are brought into full contact with each other by moving the second chuck toward the first chuck. The second distance is in the range between 100 to 150 micrometers. The bonding comprises at least one of applying heat, applying pressure, applying electrical current or applying electromagnetic radiation. The second surfaces of the first and second semiconductor structures are held in contact with the first surfaces of the first and second fixture tool components, respectively, via vacuum. The method may further include removing the fixture tool with the clamped first and second semiconductor structures from the aligner prior to the bonding and placing the fixture tool with the clamped first and second semiconductor structures in a bonder equipment. The aligner may be integrated with the bonder. The method may further include measuring and controlling the applied pressure via a force feedback sensor. The controlling of the pressurized gas includes controlling at least one of the flow rate, pressure or temperature of the pressurized gas.

In general, in another aspect, the invention features an apparatus for bonding semiconductor structures including the following equipment. Equipment for positioning a first surface of a first semiconductor structures directly opposite to and at a first distance from a first surface of a second semiconductor structure within a fixture tool. Equipment for aligning the first surfaces of the first and second semiconductor structures parallel to each other to submicron alignment accuracy, equipment for bringing the aligned first surfaces of the first and second semiconductor structures at a second distance from each other. The second distance is less than the first distance. Equipment for bringing the aligned first surfaces of the first and second semiconductor structures into atomic contact at a single point and forming a bond interface by applying pressure to the single point via a pressurized gas flowing through a port terminating at the single point. Equipment for propagating the bond interface radially across a portion of the first surfaces of the first and second semiconductor structures by controlling the pressurized gas. Equipment for reducing the pressure of the pressurized gas and bringing the first surfaces of the first and second semiconductor structures into full contact with each other. Equipment for clamping the first and second semiconductor structures together within the fixture tool and equipment for bonding the clamped first and second semiconductor structures.

In general, in another aspect, the invention features a method for bonding semiconductor structures including the following. First, positioning a first surface of a first semiconductor structures directly opposite to and at a first distance from a first surface of a second semiconductor structure. Next, aligning the first surfaces of the first and second semiconductor structures parallel to each other to submicron alignment accuracy. Next, applying pressure to a second surface of the first semiconductor structure via a pressurized gas flowing through a port terminating at the second surface and bowing the first surface of the first semiconductor structure toward the first surface of the second semiconductor structure. The second surface of the first semiconductor structure is opposite to the first surface. Next, measuring the force applied to the second surface of the first semiconductor structure and then moving the first surface of the second semiconductor structure toward the first surface of the first semiconductor structure until the measured force reaches a set value. Next, controlling the velocity of the second semiconductor motion so that when the first surfaces are brought in atomic contact and a bond interface is formed, the bond interface propagates radially across the first surfaces at a set rate. Next, reducing the pressure of the pressurized gas when the first surfaces of the first and second semiconductor structures are in full contact with each other and then clamping the first and second semiconductor structures together within a fixture tool and then bonding the clamped first and second semiconductor structures.

In general, in another aspect, the invention features a method for bonding semiconductor structures including the following. First, positioning a first surface of a first semiconductor structures directly opposite to and at a first distance from a first surface of a second semiconductor structure and aligning the first surfaces of the first and second semiconductor structures parallel to each other to submicron alignment accuracy. Next, applying pressure to a second surface of the first semiconductor structure via a pressurized gas flowing through a port terminating at a single point of the second surface and bowing the first surface of the first semiconductor structure toward the first surface of the second semiconductor structure. The second surface is opposite to the first surface. Next, bringing the aligned first surfaces of the first and second semiconductor structures into atomic contact and forming a bond interface by increasing the pressure of the pressurized gas and/or by moving the first surface of the second semiconductor structure toward the first surface of the first semiconductor structure until the applied force reaches a set value. Next, propagating the bond interface radially across the first surfaces of the first and second semiconductor structures at a set radial velocity rate by controlling the pressure of the pressurized gas and/or controlling the velocity of the second semiconductor structure motion.

The details of one or more embodiments of the invention are set forth in the accompanying drawings and description below. Other features, objects and advantages of the invention will be apparent from the following description of the preferred embodiments, the drawings and from the claims.

BRIEF DESCRIPTION OF THE DRAWINGS

Referring to the figures, wherein like numerals represent like parts throughout the several views.

DETAILED DESCRIPTION OF THE INVENTION

Figure 1A:
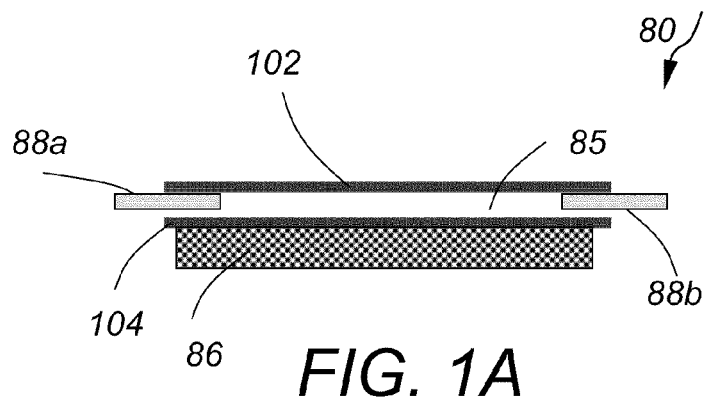
FIG. 1A is a schematic diagram of a two wafer bonding set-up at the stage before the bonding is initiated.
Figure 1B:
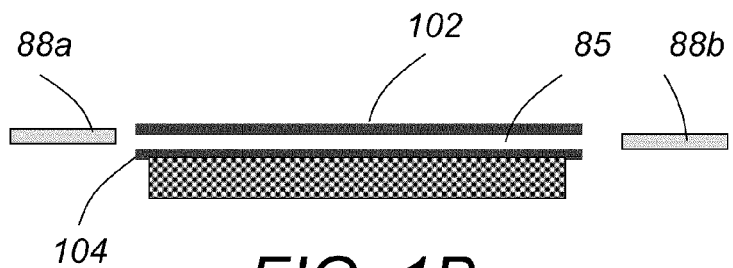
FIG. 1B is a schematic diagram of the two wafer bonding set-up of FIG. 1A at the stage where the top wafer floats on top of the lower wafer.
Figure 1C:
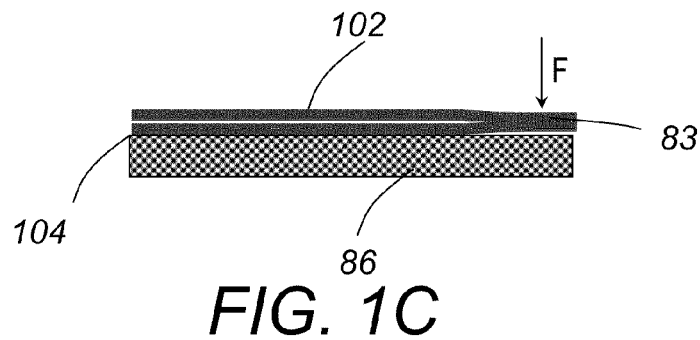
FIG. 1C is a schematic diagram of the two wafer bonding set-up of FIG. 1B at the stage where the bonding is initiated at the edge of the wafers.
Figure 1D:
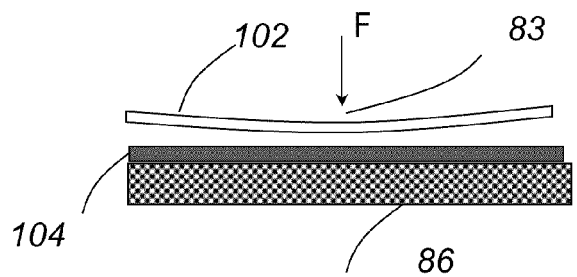
FIG. 1D is a schematic diagram of the two wafer bonding set-up of FIG. 1B at the stage where the bonding is initiated at the center of the wafers.

Referring to FIG. 1A, in a typical direct wafer bonding process 80, wafers 102, 104 are oriented horizontally and are aligned parallel to each other. The lower wafer 104 is placed face up on a flat lower carrier (chuck) 86. The upper wafer 102 is placed face down on mechanical spacers 88a, 88b. The proximity gap 85 between the wafers is defined by the spacer thickness and position. Next, the spacers 88a, 88b are removed and the upper wafer 82 floats on top of the lower wafer 85 due to the air cushion 85 between the two flat surfaces, as shown in FIG. 1B. Next, a force F is applied at one single point 83 (typically at wafer edge, shown in FIG. 1C, or center, shown in FIG. 1D) to bring the wafers 102, 104 in close proximity or atomic contact and initiate the bonding based on Van-der-Waals forces. A linear or circular bond-front propagates, moving the air out of the contact interface and leaving the surfaces in atomic contact.

Figure 2:
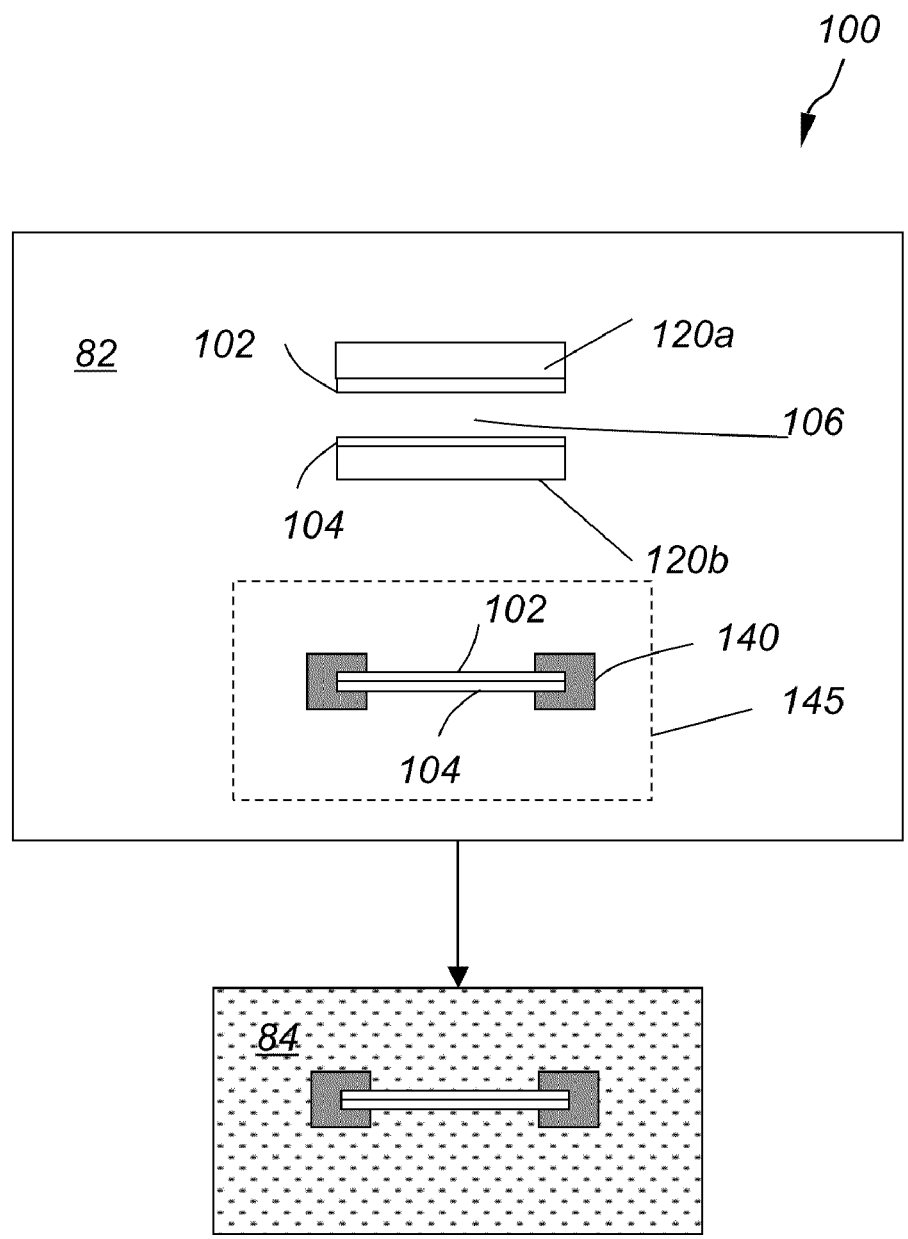
FIG. 2 is a schematic overview diagram of a first embodiment of the wafer bonding system.
Figure 4A:
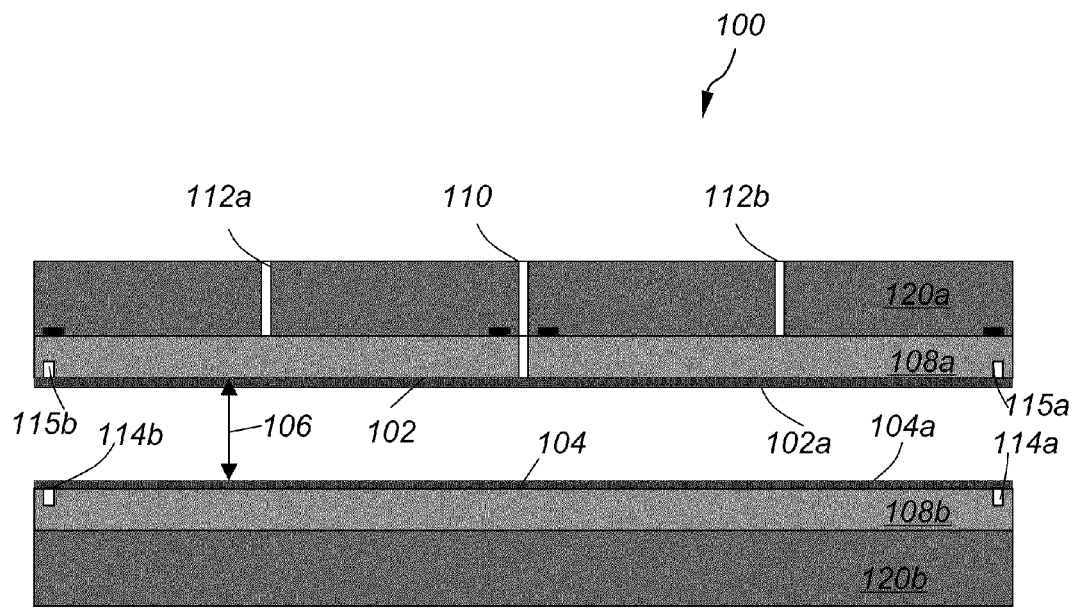
FIG. 4A is a schematic diagram of the wafer bonding alignment and fixation tool of the embodiment of FIG. 2 at the stage before the bonding is initiated.

Referring to FIG. 2, an improved wafer bonding equipment system 100 includes wafer aligner equipment 82 and wafer bonder equipment 84. Wafer aligner 82 includes an improved wafer fixation tool 145 that provides controlled atomic contact between the wafer surfaces and controlled removal of the fixation tool with the contacted aligned wafers from the aligner 82. Wafers 102, 104 are introduced in the aligner 82 and are aligned to a submicron accuracy level at a gap distance 106. Referring to FIG. 4A, lower wafer 104 is placed on a lower tooling plate 108b with its top surface 104a facing upward and is held in place on the top surface of the lower tooling plate 108b with vacuum drawn through the outer edge vacuum grooves 114a, 114b. Lower tooling plate 108b is placed on top of the aligner lower chuck 120b so that its bottom surface is in contact with the top surface of the lower chuck 120b. An upper tooling plate 108a holds wafer 102 so that its bottom surface 102a faces downward. Upper wafer 102 is held in place by the upper tooling plate 108a with vacuum drawn through the outer edge vacuum grooves 115a, 115b. Upper tooling plate 108a with the attached wafer 102 is held by an upper aligner chuck 120a via vacuum drawn through the two peripheral ports 112a, 112b. Peripheral ports 112a, 112b extend through the thickness of the upper chuck 120a and are used to draw vacuum for holding the upper tooling plate 108a. Peripheral ports 112a, 112b are also used to flow pressurized gas to the back surface of the upper tooling plate 108a to separate the upper tooling plate 108a from the upper chuck 120a in a controllable way, as will be described below. Furthermore, a central port 110 extends through the thickness of the upper chuck and the thickness of the upper tooling plate 108a and is used to flow pressurized gas to the back surface of wafer 102, as will be described below.

Figure 4B:
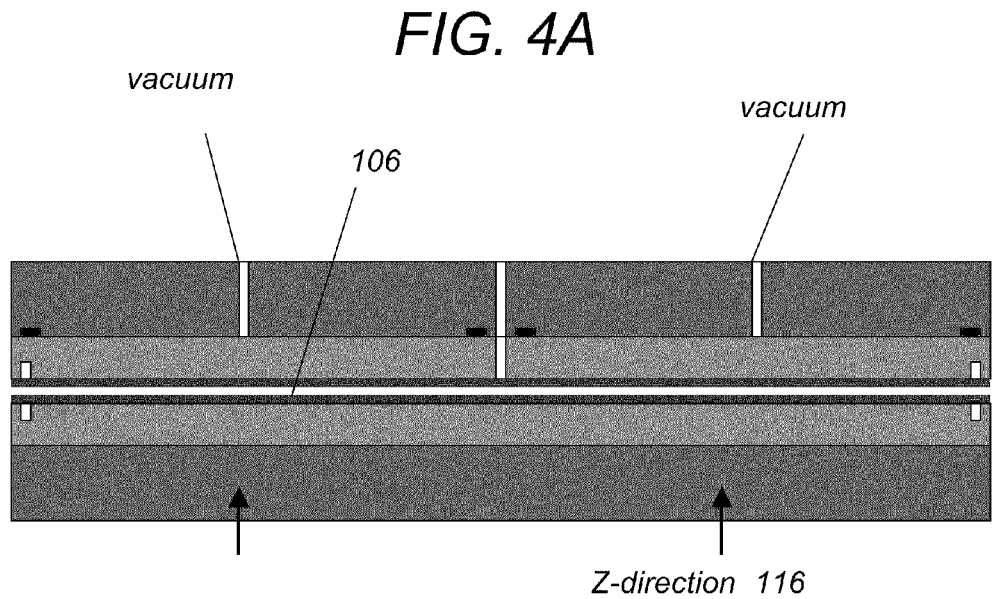
FIG. 4B is a schematic diagram of the wafer bonding alignment and fixation tool of the embodiment of FIG. 2 after the alignment of the wafers.
Figure 4C:
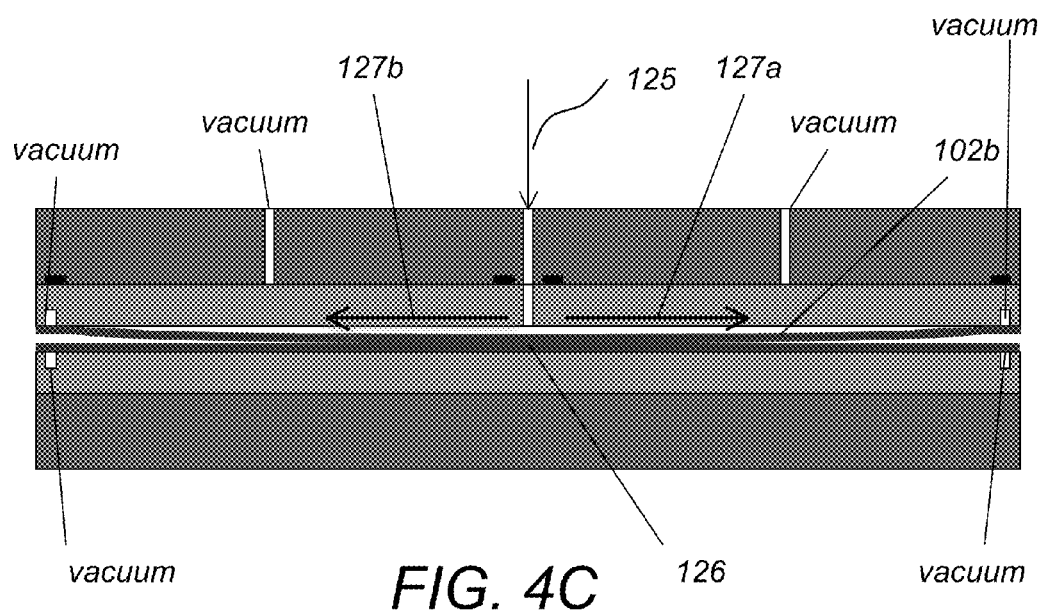
FIG. 4C is a schematic diagram of the wafer bonding alignment and fixation tool of the embodiment of FIG. 2 at the bond initiation stage.
Figure 4D:
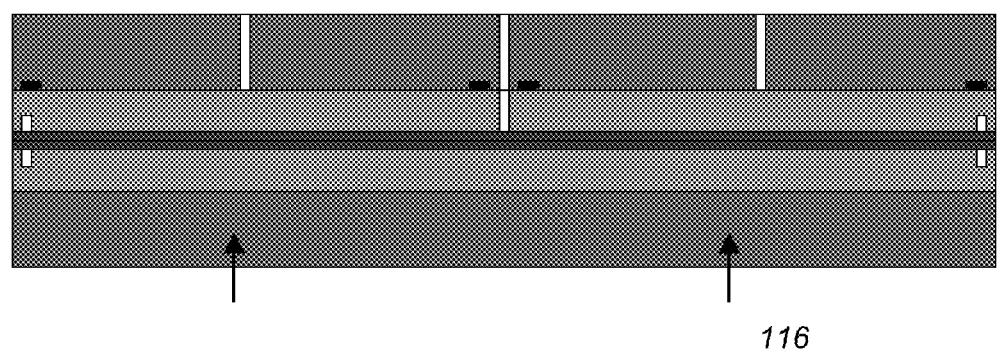
FIG. 4D is a schematic diagram of the wafer bonding alignment and fixation tool of the embodiment of FIG. 2 at the bond completion stage.
Figure 4E:
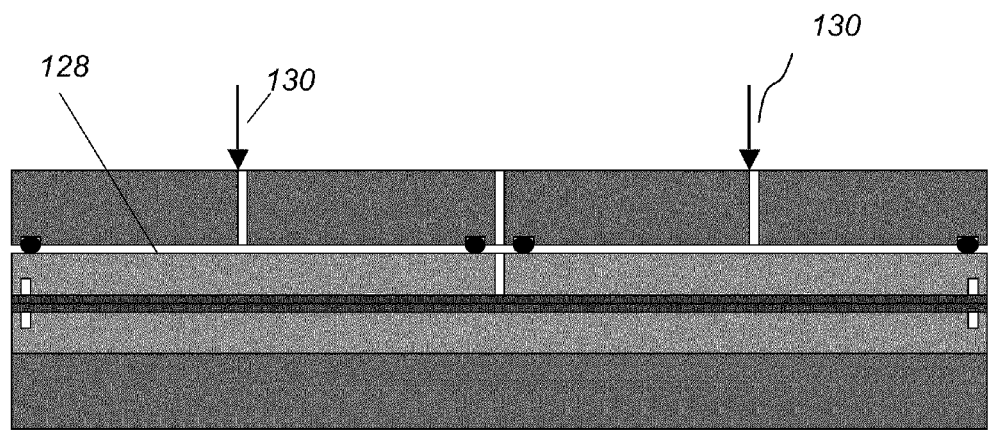
FIG. 4E is a schematic diagram of the separation of the fixation tool from the wafer bonding alignment tool.
Figure 4F:
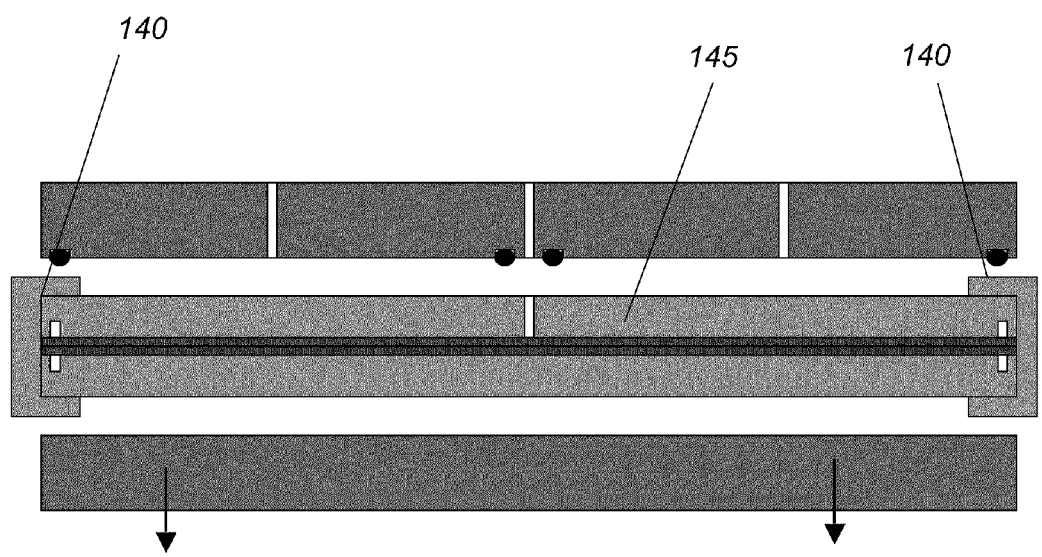
FIG. 4F depicts a schematic diagram of the clamped separated fixation tool with the aligned wafer pair.

Initially wafers 102, 104 are aligned so that surfaces 102a and 104a are parallel to each other at a gap distance 106. Referring to FIG. 4B, the gap 106 is closed to a distance of about 100-150 microns, by moving the lower chuck up in the direction 116. At this point, wafers 102, 104 are held in contact with upper and lower tooling plates 108a, 108b, respectively, by drawing vacuum thought the edge vacuum grooves 115a, 115b and 114a, 114b, respectively. Referring to FIG. 4C, pressurized gas 125 is introduced through the central port 110. The flow rate, temperature and pressure of gas 125 are controlled. In one example, gas 125 is nitrogen and its pressure is increased in 50 mbar steps. As the pressure of gas 125 increases the back surface 102b of wafer 102 is pushed down and the upper wafer 102 is bowed downward, as shown in FIG. 4C. At a gas pressure of about 200 mbar, atomic contact is initiated between the surfaces 102a, 104a at point 126 below the distal end of port 110. The applied force at point 126 is determined via a force feedback sensor (not shown). In one example the force feedback sensor is a strain gauge. Radial propagation of the gas pressure front along directions 127a, 127b brings the surfaces 102a, 104b of the two wafers in atomic contact with each other. The contact area of surfaces 102a, 104b depends upon the applied gas pressure and the distance between the wafers. Similarly, the bond front propagation velocity depends upon the applied gas pressure 125 and the distance 106 between the wafers. Accordingly, the bond front propagation rate and the size of the bonded area are controlled by adjusting the pressure of the applied gas 125 and by adjusting the distance 106 between the wafers by moving the lower chuck 120b upward in direction 116. Once full atomic contact between surfaces 102a, 104b is achieved at point 126, the gas 125 pressure is reduced and the lower chuck 120b is moved upward in direction 116 to close the gap between the back side 102b of wafer 102 and the upper tooling plate 108a, as shown in FIG. 4D. Next, the vacuum drawn through the peripheral ports 112a, 112b is turned off and pressurized gas 130 is flown through ports 112a, 112b to the back surface of the upper tooling plate 108a to separate the upper tooling plate 108a from the upper chuck 120a in a controlled way along plane 128, as shown in FIG. 4E. In one example, pressurized gas 130 is compressed dry air at a pressure of 20 mbars. In the following step, the upper and lower tooling plates 108a, 108b, with the bonded wafers 102, 104 are clamped together at the edges with clamps 140, as shown in FIG. 4F and the lower chuck 120b is moved down in direction 117. The clamped fixture 145 with the bonded wafers 102, 104 is then moved to the bonding equipment 84 for post processing, as shown in FIG. 2. Post processing in bonding equipment 84 includes annealing at high temperatures, application of pressure, electrical fields or other electromagnetic radiation, among others.

Figure 3A:
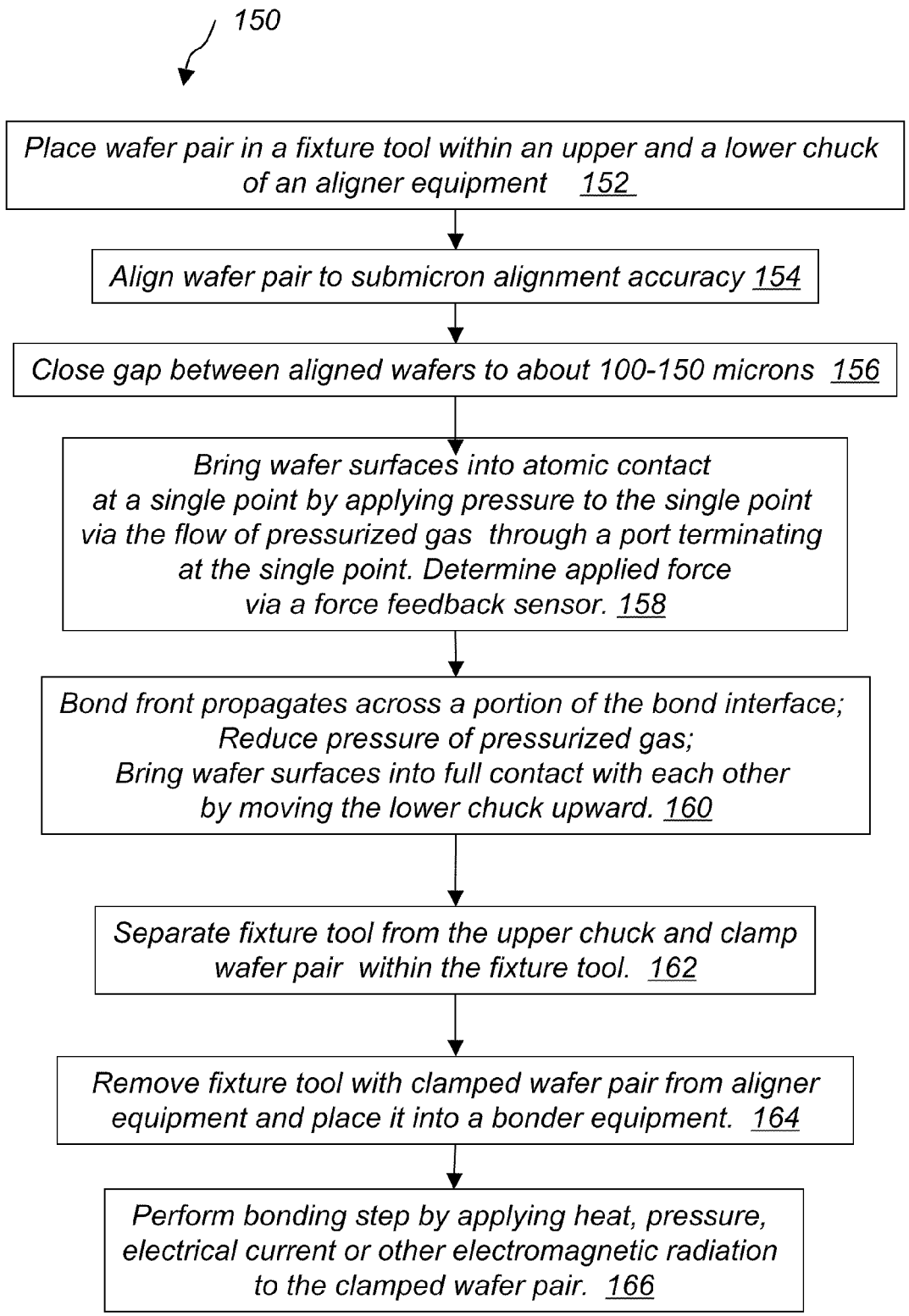
FIG. 3A is a flow diagram of a first embodiment of the wafer bonding method.

Referring to FIG. 3A, the improved wafer bonding method 150 includes the following steps. First a wafer pair is held within a fixture tool 145 and the fixture tool with the wafer pair is placed between the upper and lower chuck of a an aligner (152), as was described above and shown in FIG. 4A. Next, the wafer pair is aligned to submicron alignment accuracy (154) and the gap between the aligned wafers is closed to about 100-150 microns (156), as was described above and shown in FIG. 4B. Next, the wafer surfaces are brought into atomic contact at a single point 126 by applying gas pressure to the back surface of one of the two wafers at the single point via the flow of pressurized gas through a port terminating at the single point (158), as was described above and shown in FIG. 5A. The applied force at the single point is determined via a force feedback sensor. Next, the applied gas pressure is radially distributed along the back surface of the wafer and the bond-front propagates across a portion of the bond interface. The applied pressure of the pressurized gas is reduced and the two wafer surfaces are brought into full atomic contact with each other by moving the lower chuck upward (160), as was described above and shown in FIG. 5B. Upon completion, the fixture tool is separated from the upper chuck and the wafer pair is clamped within the fixture tool (162), as was described above and shown in FIG. 6A. Next, the fixture tool is removed from the aligner and is placed in the bonder equipment (164). In the bonder equipment, post processing of the bonded wafer pair occur including application of heat, pressure, electrical current or other electromagnetic radiation, among others (166).

Figure 3B:
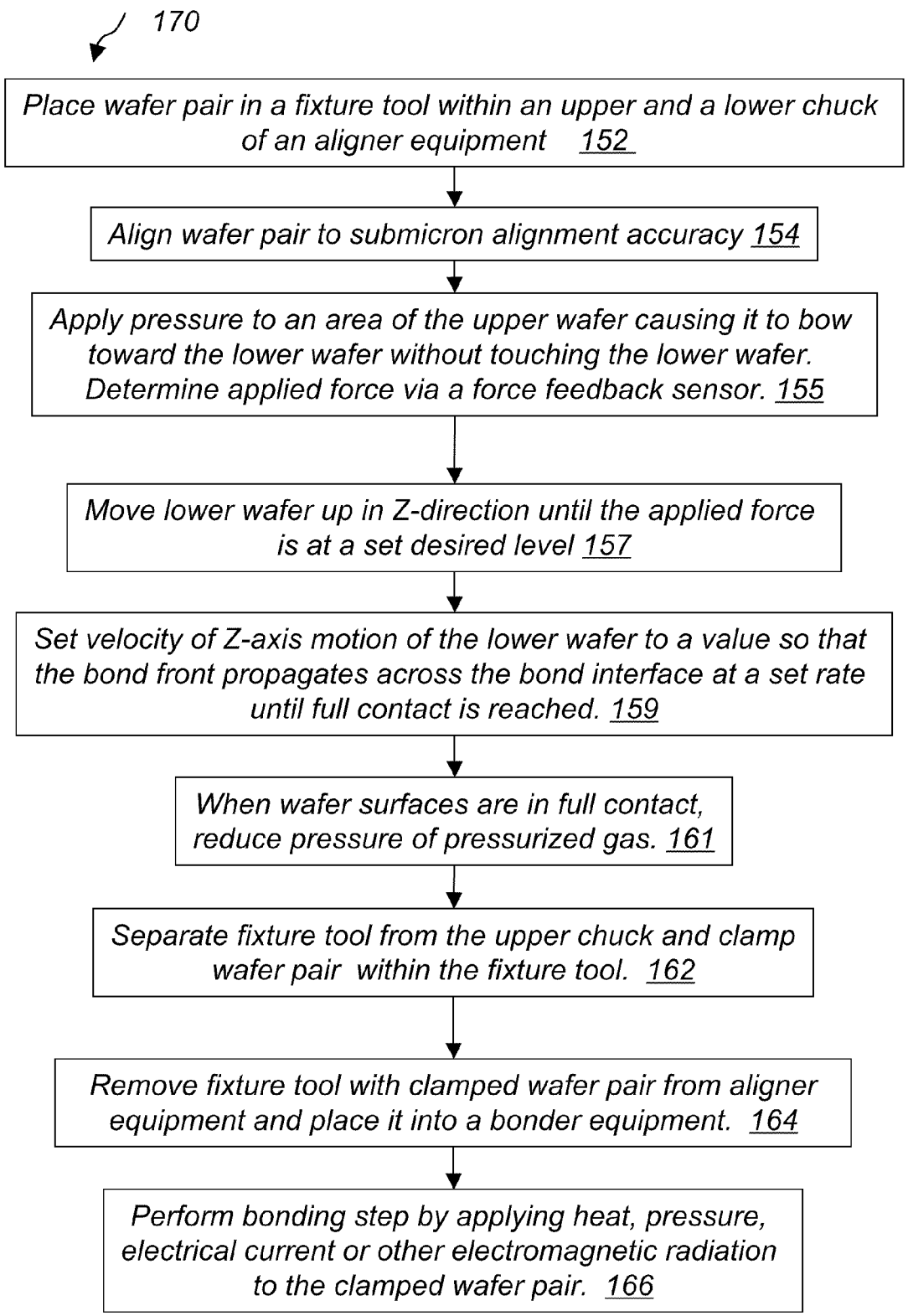
FIG. 3B is a flow diagram of a second embodiment of the wafer bonding method.
Figure 5A:
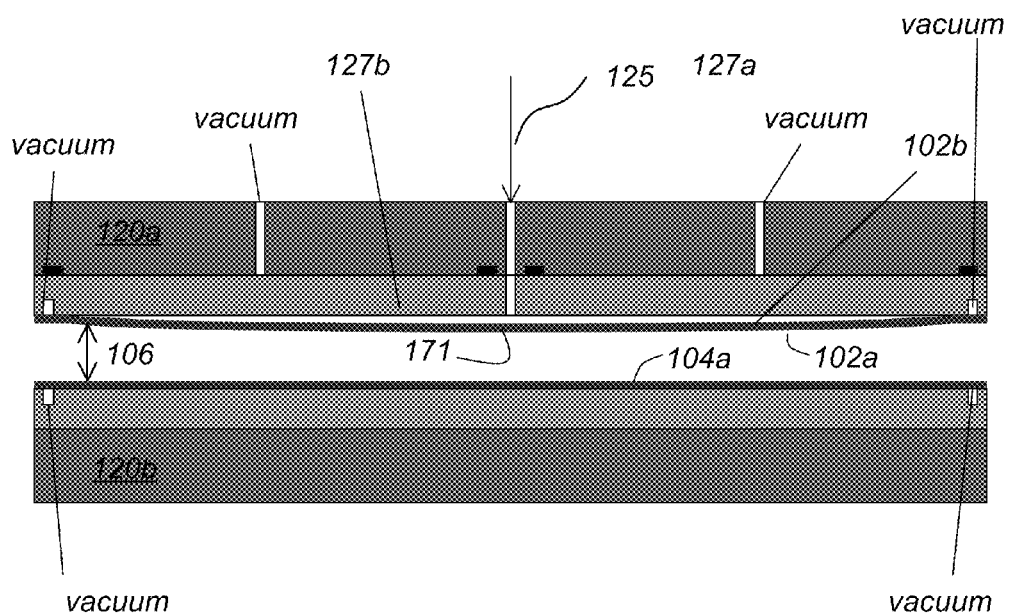
FIG. 5A is a schematic diagram of step 155 of the method in FIG. 3B.
Figure 5B:
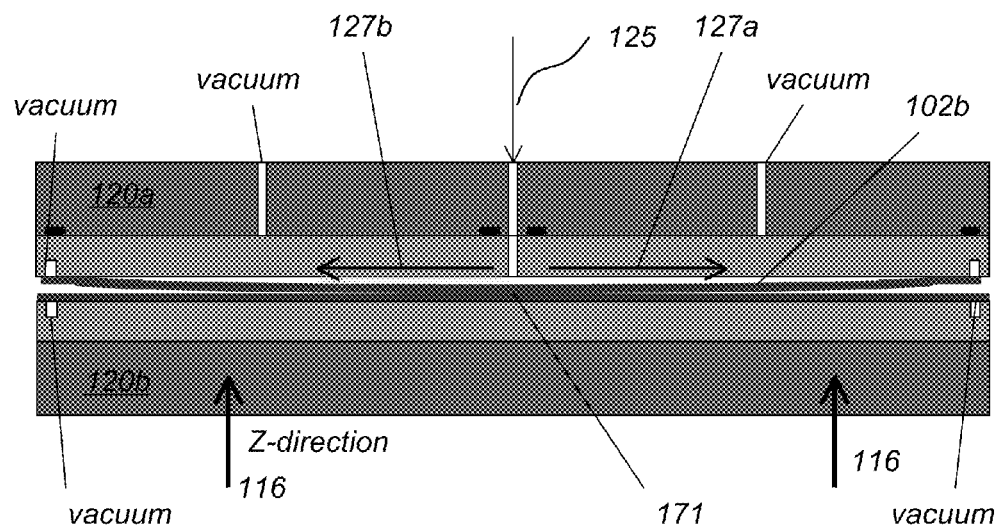
FIG. 5B is a schematic diagram of steps 157 and 159 of the method in FIG. 3B.

Referring to FIG. 3B, in another embodiment the improved wafer bonding method 170 includes the following steps. First a wafer pair is held within a fixture tool 145 and the fixture tool with the wafer pair is placed between the upper 120a and lower 120b chuck of an aligner (152), as was described above and shown in FIG. 4A. Next, the wafer pair is aligned to submicron alignment accuracy (154) at a first distance 106 from each other, as was described above and shown in FIG. 4B. Next, the upper wafer 102 is bowed downward by applying gas pressure to its back surface 102b via the flow of pressurized gas 125 through a port 110 terminating at the patch area 171 (155), as shown in FIG. 5A. The gas pressure is held constant at a set value so that the upper wafer surface 102a is not in touch with the lower wafer surface 104a. The force applied onto upper wafer 102 is determined via a force feedback sensor. Next, the lower chuck 120b is moved up in the Z-direction 116 until the lower wafer surface 104a comes into contact with the upper wafer surface 102a in the patch area 171 and the applied force to the patch area 171 is at a set desired value (157), as shown in FIG. 5B. Next, the lower chuck 120b is moved further up in the Z-direction 116 and the vertical Z-velocity of the lower chuck 120b is controlled and set at a value so that the radial propagation velocity of the bond interface is at a desired set rate (159). When full contact between the two wafer surfaces 102a, 104a is reached the gas pressure is reduced (161) and then the fixture tool 145 is separated from the upper chuck 120a and the wafer pair is clamped within the fixture tool 145 (162), as was described above and shown in FIG. 4F. Next, the fixture tool 145 is removed from the aligner and is placed in the bonder equipment (164). In the bonder equipment, post processing of the bonded wafer pair occur including application of heat, pressure, electrical current or other electromagnetic radiation, among others (166).

In one example, the following parameter settings are used to control the radial bond interface propagation speed to be 10 mm/sec. First, the applied gas pressure 125 through port 110 in step 155 is set at 150 mbar and the distance 106 between the wafer surfaces 102a and 104a is about 1 millimeter. Wafers 102 and 104 have a diameter of 300 mm. The lower chuck is moved up along Z-axis 116 until the force on a patch area 171 having a diameter of 50 mm is measured to be 306 grams. The vertical Z-velocity of the lower chuck 120b is then controlled to be at 36.8 µm/sec so that the remaining uncontacted areas of the two 300 mm diameter wafers 102, 104 are in full contact within a time of 12.5 sec. These parameter settings result in a radial bond propagation velocity of 10 mm/sec.

Figure 6:
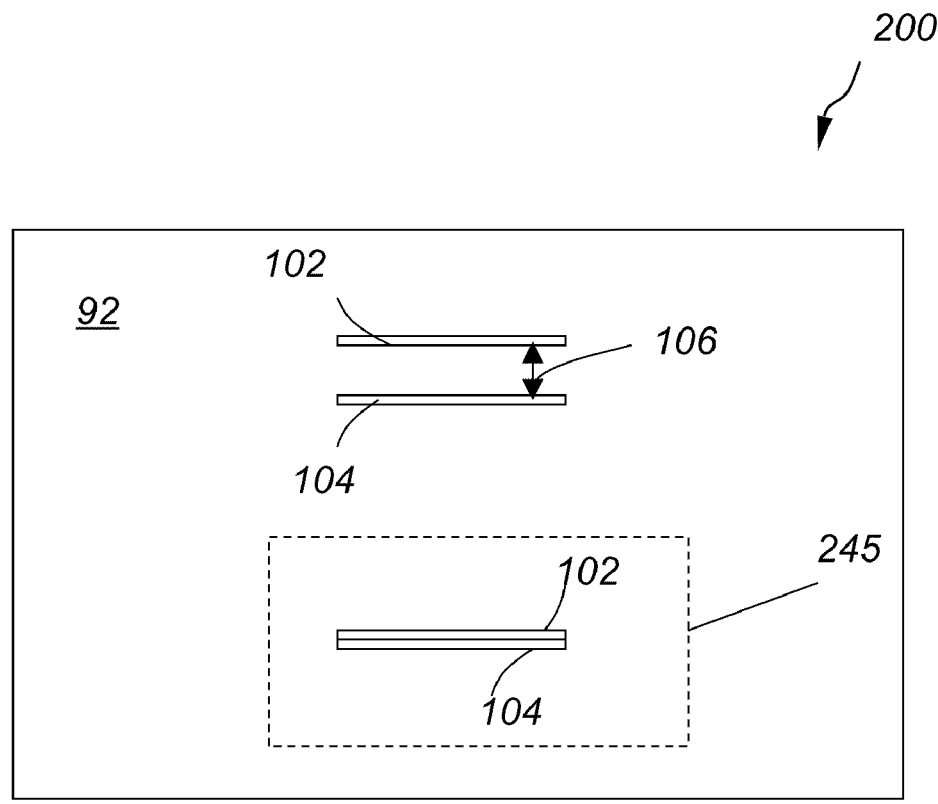
FIG. 6 is a schematic overview diagram of a second embodiment of the wafer bonding system.
Figure 8A:
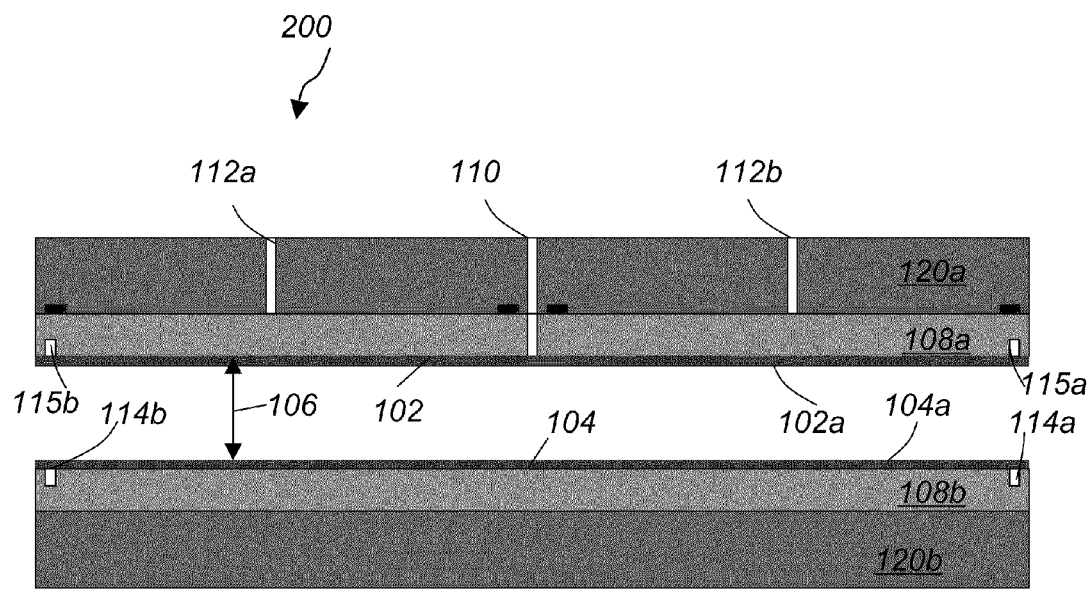
FIG. 8A is a schematic diagram of the wafer bonding alignment tool of the embodiment of FIG. 7 at the stage before the bonding is initiated.

Referring to FIG. 6, in another embodiment the improved wafer bonding system 200 includes wafer aligner equipment 92 and an improved wafer tool 245 that provides controlled atomic contact between the wafer surfaces. In this embodiment, any post processing of the direct bond between the wafer surfaces that may be needed is performed within the aligner equipment 92. Wafers 102, 104 are introduced in the aligner 92 and are aligned to a submicron accuracy level at a gap distance 106. As shown in FIG. 8A, wafer 104 is placed on a lower tooling plate 108b with its top surface 104a facing upward and is held in place on the top surface of the lower tooling plate 108b with vacuum drawn through the outer edge vacuum grooves 114a, 114b. Lower tooling plate 108b is placed on top of the aligner lower chuck 120b so that its bottom surface is in contact with the top surface of the lower chuck 120b. An upper tooling plate 108a holds wafer 102 so that its bottom surface 102a faces downward. Wafer 102 is held in place by the upper tooling plate 108a with vacuum drawn through the outer edge vacuum grooves 115a, 115b. Upper tooling plate 108a with the attached wafer 102 is held by an upper aligner chuck 120a via vacuum drawn through the two peripheral ports 112a, 112b. Peripheral ports 112a, 112b extend through the thickness of the upper chuck and are used to draw vacuum for holding the upper tooling plate 108a. Alternatively, peripheral ports 112a, 112b are used to flow pressurized gas to the back surface of the upper tooling plate 108a to separate, in a controllable way, the upper tooling plate 108a from the upper chuck 120a. Furthermore a central port 110 extends through the thickness of the upper chuck and the thickness of the upper tooling plate 108a and is used to flow pressurized gas to the back surface of wafer 102, as will be described below.

Figure 8B:
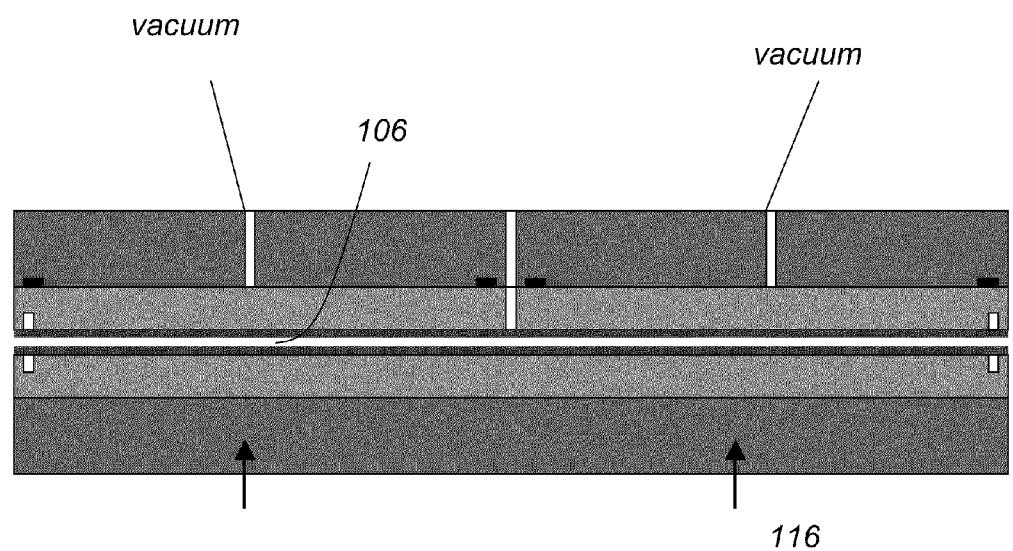
FIG. 8B is a schematic diagram of the wafer bonding alignment tool of the embodiment of FIG. 7 after the alignment of the wafers.
Figure 8C:
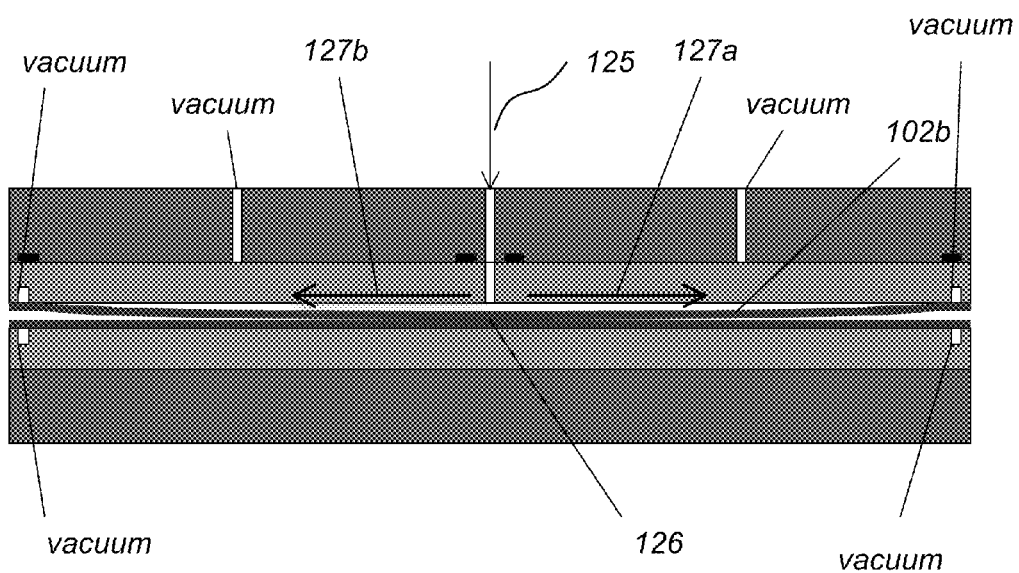
FIG. 8C is a schematic diagram of the wafer bonding alignment tool of the embodiment of FIG. 7 at the bond initiation stage.
Figure 8D:
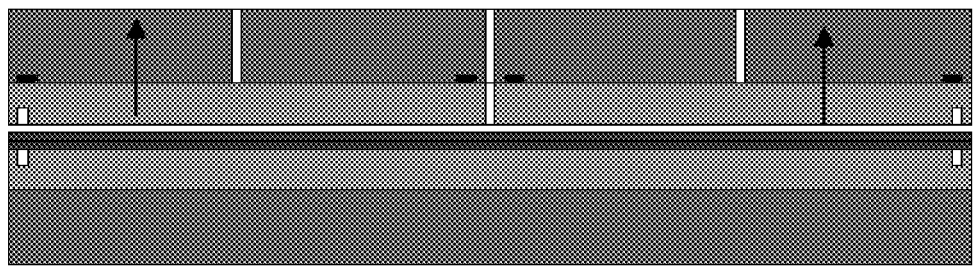
FIG. 8D is a schematic diagram of the wafer bonding alignment tool of the embodiment of FIG. 7 at the bond completion stage.
Figure 8E:
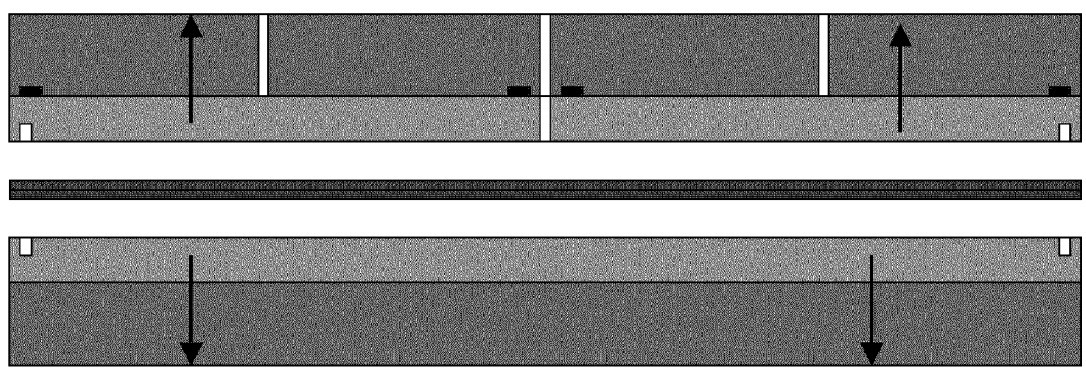
FIG. 8E is a schematic diagram of the separation of the bonded wafers in the embodiment of FIG. 7.

Initially wafers 102, 104 are aligned so that surfaces 102a and 104a are parallel to each other at a gap distance 106. As, shown in FIG. 8B, the gap 106 is closed to a distance of about 100-150 microns, by moving the lower chuck up in the direction 116. At this point, wafers 102, 104 are held in contact with upper and lower tooling plates 108a, 108b, respectively, by drawing vacuum thought the edge vacuum grooves 115a, 115b and 114a, 114b, respectively. As shown in FIG. 8C, pressurized gas 125 is introduced through the central port 110. The flow rate, temperature and pressure of gas 125 are controlled. In one example, gas 125 is nitrogen and its pressure is increased in 50 mbar steps. As the pressure of gas 125 increases the back surface 102b of wafer 102 is pushed downward. At a gas pressure of about 200 mbar, atomic contact is initiated between the surfaces 102a, 104a at point 126 below the distal end of port 110. The applied force at the single point is determined via a force feedback sensor. Radial propagation of the gas pressure front along directions 127a, 127b brings the surfaces 102a, 104b of the two wafers in full atomic contact with each other. The contact area of surfaces 102a, 104b depends upon the applied gas pressure and the distance between the wafers. Similarly, the bond front propagation speed depends upon the applied gas pressure and the distance between the wafers. Accordingly, the bond front propagation speed and the bonded area are controlled by adjusting the pressure of applied gas 125 and by adjusting the distance between the wafers by moving the lower chuck 120b upward in direction 116. Once the desired area of atomic contact between surfaces 102a, 104b is achieved, the gas 125 pressure is reduced, the vacuum through the edge vacuum grooves 114a, 114b is turned off and the lower chuck 120b with the lower tooling plate 108b is moved downward in direction 117. In the following step, the direct bonded wafers 102, 104 are separated from the upper and lower tooling plates 108a, 108b and are removed from the aligner/bonder system 92, as shown in FIG. 8E. A high temperature annealing step may also be performed prior to the removal of the bonded wafer pair from the aligner/bonder system 92 or after the removal of the bonded wafer pair from the aligner/bonder system in a separate batch annealing oven 84.

Figure 7:
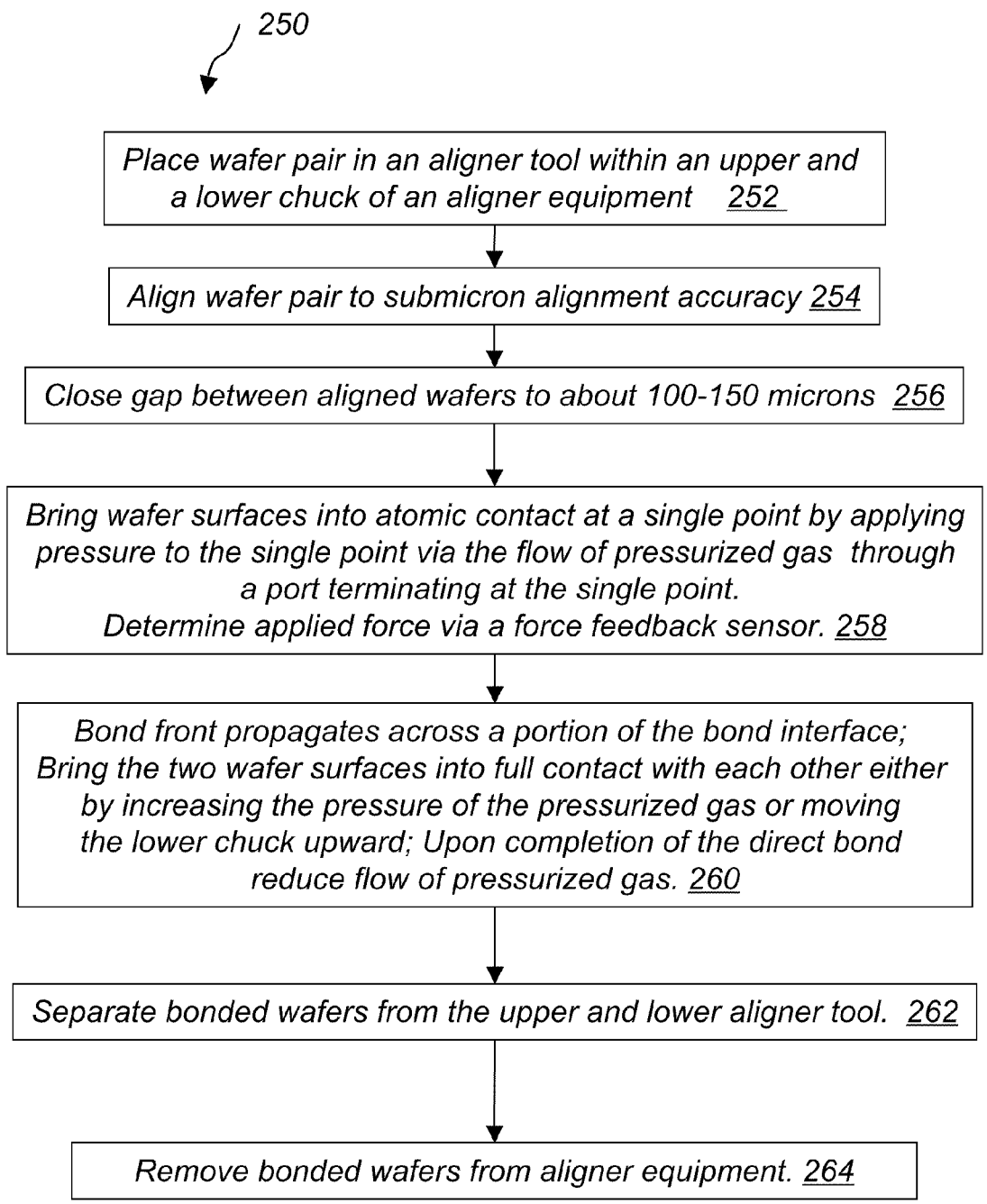
FIG. 7 is a flow diagram of the wafer bonding method performed in the system of FIG. 6.

Referring to FIG. 7, the improved wafer bonding method 250 includes the following steps. First a wafer pair is held within an aligner tool and the aligner tool with the wafer pair is placed between the upper and lower chuck of an aligner (252), as was described above and shown in FIG. 8A. Next, the wafer pair is aligned to submicron alignment accuracy (254) and the gap between the aligned wafers is closed to about 100-150 microns (256), as was described above and shown in FIG. 8B. Next, the wafer surfaces are brought into atomic contact at a single point by applying pressure to the single point via the flow of pressurized gas through a port terminating at the single point (258), as was described above and shown in FIG. 8C. In other embodiments, the pressurized gas causes the upper wafer 102 to bow downward and then the lower wafer 104 is moved up until it contacts the upper wafer. The wafer contact and the applied force are determined via a force feedback sensor. Next, the bond front propagates across a portion of the bond interface and the two wafer surfaces are brought into full atomic contact with each other (260) by either increasing the pressure of the pressurized gas 125 and/ or moving the lower chuck 120b upward to close the distance between the wafers, as was described above and shown in FIG. 8D. Upon completion, the flow of the pressurized gas is reduced and the bonded wafers are separated from the upper and lower alignment plates and the upper and lower chuck (262) and the wafer pair is removed from the aligner (264).

Among the advantages of this invention may be one or more of the following. The submicron alignment accuracy is maintained in the final alignment of the bonded wafers. This reduces the alignment distortion of the prior art wafer bonding methods by a substantial factor. The radial wafer-to-wafer propagation of the bond-front pushes air pocket voids out resulting in a void free wafer bond. The W2W bonding method of the present invention may be used for almost any type of bonding including direct/fusion/oxide bonding, thermocompression bonding, plasma activated bonding, and diffusion bonding, among others. The method provides process control and repeatability through the control of the pressure, flow rate, temperature and chemistry of the pressurized gas and/or the inter-wafer distance.

Several embodiments of the present invention have been described. Nevertheless, it will be understood that various modifications is made without departing from the spirit and scope of the invention. Accordingly, other embodiments are within the scope of the following claims.

What is claimed is:

1. A method for bonding semiconductor structures comprising:
    positioning a first surface of a first semiconductor structures directly opposite to and at a first distance from a first surface of a second semiconductor structure within a fixture tool of an aligner equipment;
    aligning said first surfaces of said first and second semiconductor structures parallel to each other to submicron alignment accuracy;
    bringing said aligned first surfaces of said first and second semiconductor structures at a second distance from each other wherein said second distance is less than said first distance;
    bringing said aligned first surfaces of said first and second semiconductor structures into atomic contact at a single point and forming a bond interface by applying pressure to said single point via a pressurized gas flowing through a port terminating at said single point;
    propagating said bond interface radially across a portion of said first surfaces of said first and second semiconductor structures by controlling said pressurized gas;
    reducing the pressure of the pressurized gas and bringing said first surfaces of said first and second semiconductor structures into full contact with each other;
    clamping said first and second semiconductor structures together within said fixture tool; and
    bonding said clamped first and second semiconductor structures.

2. The method of claim 1, wherein said fixture tool comprises first and second fixture tool components and wherein a first surface of said first fixture tool component is placed in contact with a second surface of said first semiconductor structure and a first surface of said second fixture tool component is placed in contact with a second surface of said second semiconductor surface, and wherein said second surfaces of said first and second semiconductor structures are opposite to said first surfaces of said first and second semiconductor structures, respectively.

3. The method of claim 2 wherein said aligner comprises oppositely arranged first and second chucks and wherein a second surface of said first fixture tool component is in contact with said first chuck and a second surface of said second fixture tool component is in contact with said second chuck, and wherein said second surfaces of said first and second fixture tool components are opposite to said first surfaces of said first and second fixture tool components, respectively.

4. The method of claim 3, wherein said first and second surfaces of said first and second semiconductor structures are brought into full contact with each other by moving said second chuck toward said first chuck.

5. The method of claim 4 wherein said second distance is in the range between 100 to 150 micrometers.

6. The method of claim 5 wherein said bonding comprises at least one of applying heat, applying pressure, applying electrical current or applying electromagnetic radiation.

7. The method of claim 6 wherein said second surfaces of said first and second semiconductor structures are held in contact with said first surfaces of said first and second fixture tool components, respectively, via vacuum.

8. The method of claim 1 further comprising
    removing said fixture tool with the clamped first and second semiconductor structures from said aligner prior to said bonding; and
    placing said fixture tool with the clamped first and second semiconductor structures in a bonder.

9. The method of claim 8 wherein said aligner is integrated with said bonder.

10. The method of claim 1 further comprising measuring and controlling said applied pressure via a force feedback sensor.

11. The method of claim 10 wherein said controlling of the pressurized gas comprises controlling at least one of the flow rate, pressure or temperature of said pressurized gas.

12. A method for bonding semiconductor structures comprising:
    positioning a first surface of a first semiconductor structures directly opposite to and at a first distance from a first surface of a second semiconductor structure;
    aligning said first surfaces of said first and second semiconductor structures parallel to each other to submicron alignment accuracy;
    applying pressure to a second surface of said first semiconductor structure via a pressurized gas flowing through a port terminating at said second surface and bowing said first surface of said first semiconductor structure toward the first surface of the second semiconductor structure, wherein said second surface is opposite to said first surface;
    measuring the force applied to said second surface of the first semiconductor structure;
    moving said first surface of said second semiconductor structure toward said first surface of said first semiconductor structure until said measured force reaches a set value;
    controlling the velocity of the second semiconductor structure motion so that when said first surfaces are brought in atomic contact and a bond interface is formed, said bond interface propagates radially across said first surfaces at a set rate.

13. A method for bonding semiconductor structures comprising:

positioning a first surface of a first semiconductor structures directly opposite to and at a first distance from a first surface of a second semiconductor structure;

aligning said first surfaces of said first and second semiconductor structures parallel to each other to submicron alignment accuracy;

applying pressure to a second surface of said first semiconductor structure via a pressurized gas flowing through a port terminating at a single point of said second surface and bowing said first surface of said first semiconductor structure toward the first surface of the second semiconductor structure, wherein said second surface is opposite to said first surface;

bringing said aligned first surfaces of said first and second semiconductor structures into atomic contact and forming a bond interface by increasing the pressure of the pressurized gas and/or by moving said first surface of said second semiconductor structure toward said first surface of said first semiconductor structure until the applied force reaches a set value; and propagating said bond interface radially across said first surfaces of said first and second semiconductor structures at a set radial velocity rate by controlling the pressure of the pressurized gas and/or controlling the velocity of the second semiconductor structure motion.

* * * * *